United States Patent
Ishikawa et al.

(10) Patent No.: US 6,583,032 B1
(45) Date of Patent: Jun. 24, 2003

(54) METHOD FOR MANUFACTURING SEMICONDUCTOR CHIPS

(75) Inventors: Toshihiko Ishikawa, Mitaka (JP); Yasushi Katagiri, Mitaka (JP)

(73) Assignee: Tokyo Seimitsu Co., Ltd., Tokyo (JP)

( * ) Notice: Subject to any disclaimer, the term of this patent is extended or adjusted under 35 U.S.C. 154(b) by 0 days.

(21) Appl. No.: 09/698,193

(22) Filed: Oct. 30, 2000

(30) Foreign Application Priority Data

Nov. 5, 1999 (JP) .......................................... 11-315274

(51) Int. Cl.[7] ...................... H01L 21/301; H01L 21/46; H01L 21/78
(52) U.S. Cl. .................. 438/462; 438/113; 438/114
(58) Field of Search ................ 438/113, 114, 438/110, 462

(56) References Cited

U.S. PATENT DOCUMENTS

| | | | |
|---|---|---|---|
| 4,729,971 A | 3/1988 | Coleman | 437/226 |
| 4,967,146 A * | 10/1990 | Morgan et al. | 324/158 R |
| 5,104,820 A * | 4/1992 | Go et al. | 437/51 |
| 5,632,667 A | 5/1997 | Earl et al. | |
| 5,693,182 A | 12/1997 | Mathuni | 156/645.1 |
| 5,888,883 A | 3/1999 | Sasaki et al. | 438/460 |
| 6,165,815 A * | 12/2000 | Ball | 438/113 |
| 6,184,109 B1 * | 2/2001 | Sasaki et al. | 438/464 |
| 6,221,751 B1 * | 4/2001 | Chen et al. | 438/612 |
| 6,268,237 B1 * | 7/2001 | Flesher et al. | 438/106 |
| 6,271,060 B1 * | 8/2001 | Zandman et al. | 438/113 |
| 6,271,102 B1 * | 8/2001 | Brouillette et al. | 438/462 |
| 6,329,671 B1 * | 12/2001 | Tamaki et al. | 257/48 |

FOREIGN PATENT DOCUMENTS

| | | |
|---|---|---|
| EP | 0 776 029 | 5/1997 |
| EP | 0 844 648 | 5/1998 |
| GB | 2 322 737 | 9/1998 |
| JP | 64-87305 A * | 3/1989 |
| JP | 05-315646 | 11/1993 |
| JP | 09-237901 | 9/1997 |
| JP | 10-284449 | 10/1998 |
| JP | 11-126763 | 5/1999 |

* cited by examiner

*Primary Examiner*—Olik Chaudhuri
*Assistant Examiner*—Fernando Toledo
(74) *Attorney, Agent, or Firm*—Nixon Peabody LLP; David S. Safran

(57) ABSTRACT

In a process of manufacturing semiconductor chips, first, the reverse of a wafer, on the obverse of which many chips are formed, is ground so as to shape the wafer with a predetermined thickness. Then, the reverse of the wafer is polished or etched so that the broken layer which is formed during the back grinding is removed. Next, grooves are formed on the reverse of the wafer in a predetermined depth along streets formed between the chips. Finally, the wafer is cleft along the grooves so as to be divided into separate chips. By this process, the broken layer formed on the reverse of the wafer is removed after the back grinding, then the wafer is divided into separate chips by use of the cleavage; therefore, chipping is effectively reduced.

8 Claims, 11 Drawing Sheets

F I G. 1
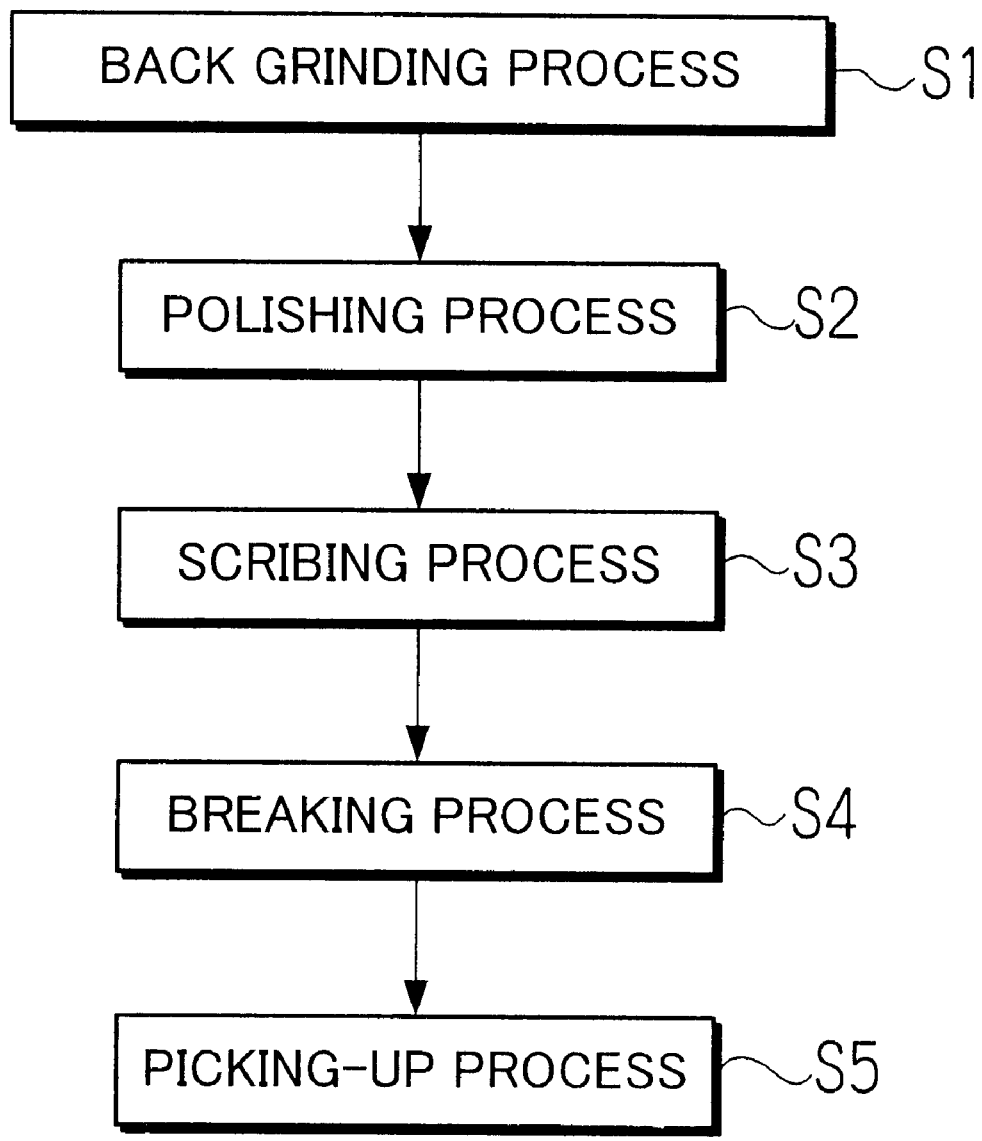

METHOD FOR MANUFACTURING SEMICONDUCTOR CHIPS

BACKGROUND OF THE INVENTION

1. Field of the Invention

The present invention relates to a method for manufacturing semiconductor chips, particularly with extremely thin chips which are as thin as 200 μm or less.

2. Description of Related Art

In the manufacturing process of semiconductor chips, many semiconductor chips are formed on the obverse of a wafer such as a silicon wafer by processing the wafer by a predetermined manner, and the wafer is then diced with a dicing machine along streets, which are formed between the chips, to separate the chips. Because of the increased number of smart cards, cellular phones and laptop personal computers, the semiconductor chips that are assembled into small devices have been required to be light-weighted and small-sized. In view of such requirements, after forming the chips on the obverse of the wafer, the reverse of the wafer is ground by a planarization apparatus so as to make the wafer thin (as thin as 200 μm or less), and then the wafer is diced to separate chips by the dicing machine. In this dicing, the dicing machine performs a full-cut (a processing method for completely cutting and dividing the wafer) for the wafer along the streets so as to separate the chips.

However, a broken layer (also called a spoiled layer or a damaged layer) is formed on the reverse of the wafer during the reverse face grinding, and the broken layer causes breakage of the extremely thin wafer with the thickness of 200 μm or less in the process afterwards. Moreover, when completely cutting the extremely thin wafer by the full-cut with the dicing machine, many inferior chips are generated due to chipping (cracks) around the chips, especially chipping (cracks) on the reverse of the wafer.

SUMMARY OF THE INVENTION

The present invention has been developed in view of the above-described circumstances, and has as its object the provision of the method of manufacturing the semiconductor chips by which extremely thin semiconductor chips can be manufactured without generating cracks or chipping.

In order to achieve the above-described objects, the present invention is directed to a method for manufacturing semiconductor chips, comprising the steps of: grinding a reverse of a wafer so as to shape the wafer in a predetermined thickness, the chips being formed on an obverse of the wafer; removing, by at least one of polishing and etching, a broken layer formed on the reverse of the wafer in the reverse grinding step; forming grooves on the reverse of the wafer in a predetermined depth along streets formed between the chips; and cleaving the wafer along the grooves so as to separate the chips.

According to the present invention, first, the reverse of a wafer, on the obverse of which many chips are formed, is ground so as to shape the wafer with a predetermined thickness. Then, the reverse of the wafer is polished or etched so that the broken layer which is formed during the back grinding is removed. Next, grooves are formed on the reverse of the wafer in a predetermined depth along streets formed between the chips. Finally, the wafer is cleaved along the grooves so as to be divided into separate chips. By polishing or etching the reverse of the wafer after the back grinding so as to remove the broken layer formed during the back grinding, the strength of the chips is improved. Moreover, by dividing the wafer from which the broken layer is removed into separate chips by using the cleavage, cracks and chipping of the reverse of the wafer are effectively reduced.

BRIEF DESCRIPTION OF THE DRAWINGS

The nature of this invention, as well as other objects and advantages thereof, will be explained in the following with reference to the accompanying drawings, in which like reference characters designate the same or similar parts throughout the figures and wherein:

FIG. 1 is a flowchart showing a method of manufacturing semiconductor chips according to an embodiment of the present invention;

DETAILED DESCRIPTION OF THE PREFERRED EMBODIMENT

FIG. 1 is a flowchart of a method of manufacturing semiconductor chips according to an embodiment of the present invention. As shown in FIG. 1, a wafer W on the obverse of which many chips are formed, is processed and divided to separate chips through a reverse (back face) grinding process (step S1), a polishing process (step S2), a scribing process (step S3), a breaking process (step S4), and a pick-up process (step S5).

Figure 2:
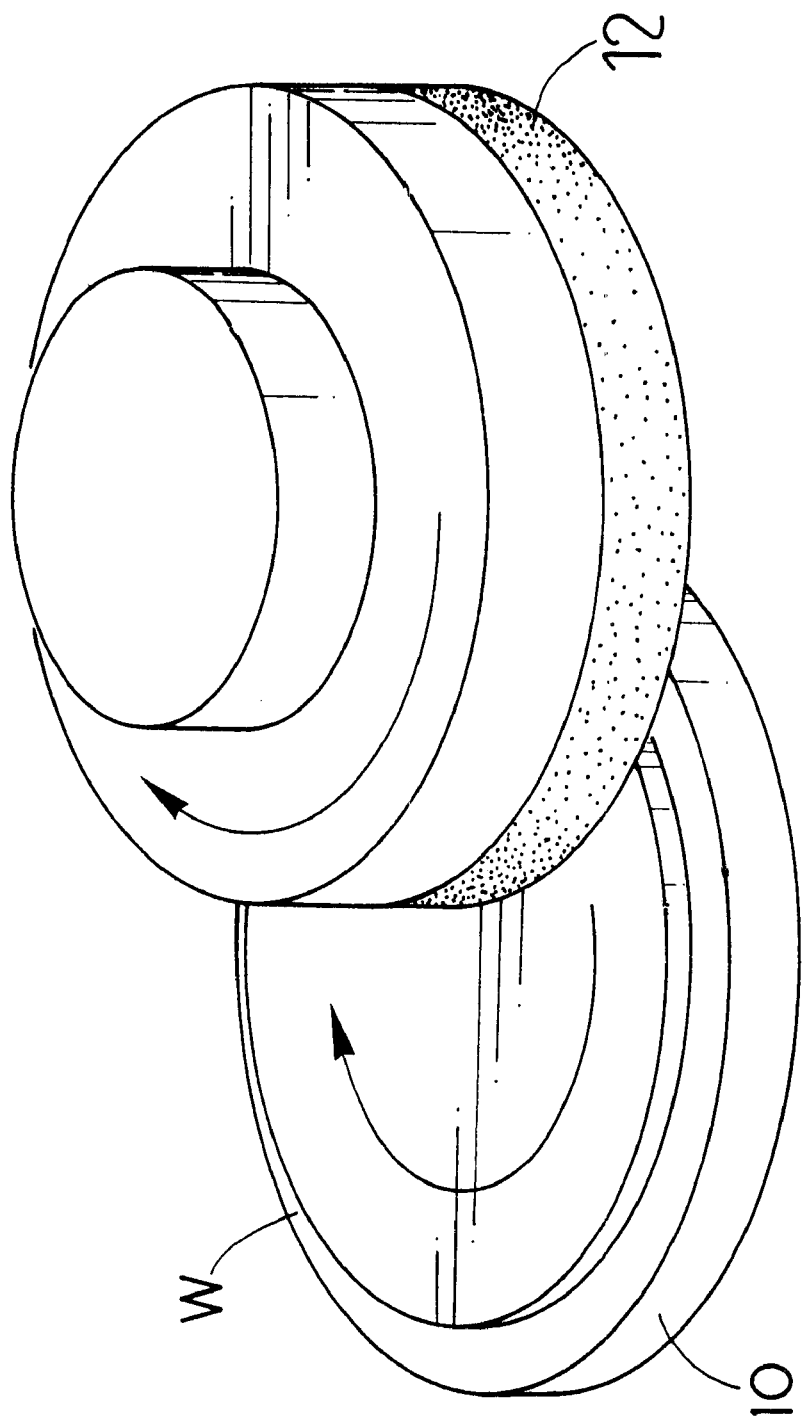
FIG. 2 is an explanatory view of a back grinding process.

In the back grinding process (step S1), the reverse of the wafer W on the obverse of which many chips are formed is ground so that the wafer W has a predetermined thickness (as thin as 200 μm or less). As shown in FIG. 2, in the back grinding process, the bottom (at the moment) face (the obverse, on which the chips are formed) of the wafer W is held by suction by a chuck table 10 and the wafer W is rotated, then the reverse of the wafer W is ground by pressing a rotating grinding wheel 12 against the top (at the moment) face (the reverse) of the rotating wafer W.

Figure 3:
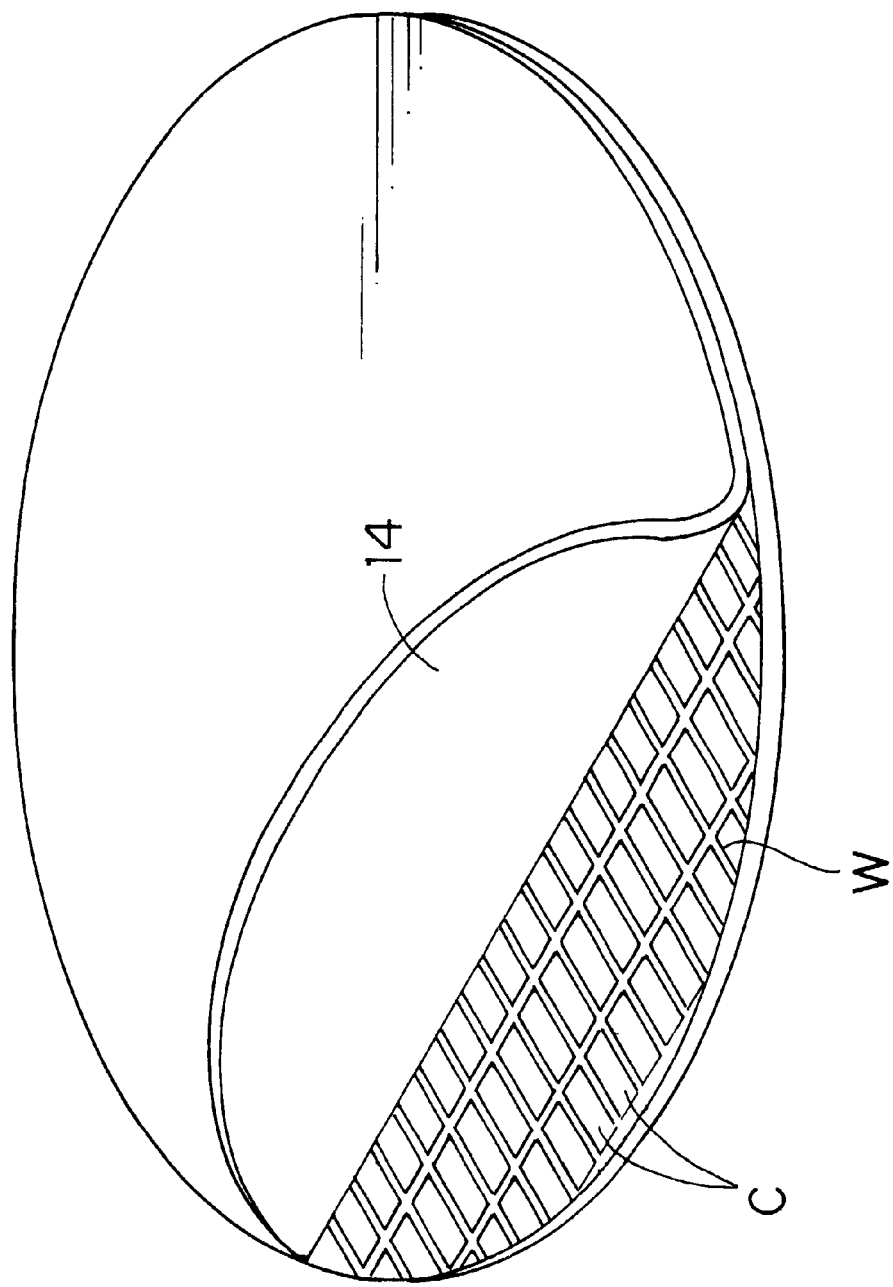
FIG. 3 is a perspective view showing a protecting sheet which is adhered to the obverse of a wafer.

As shown in FIG. 3, a protecting sheet 14 is adhered to the obverse of the wafer during the processes in order to protect chips C, C, . . . , which are formed on the obverse of the wafer W. Thereby, the chips C are protected from stains and damages.

Figure 4:
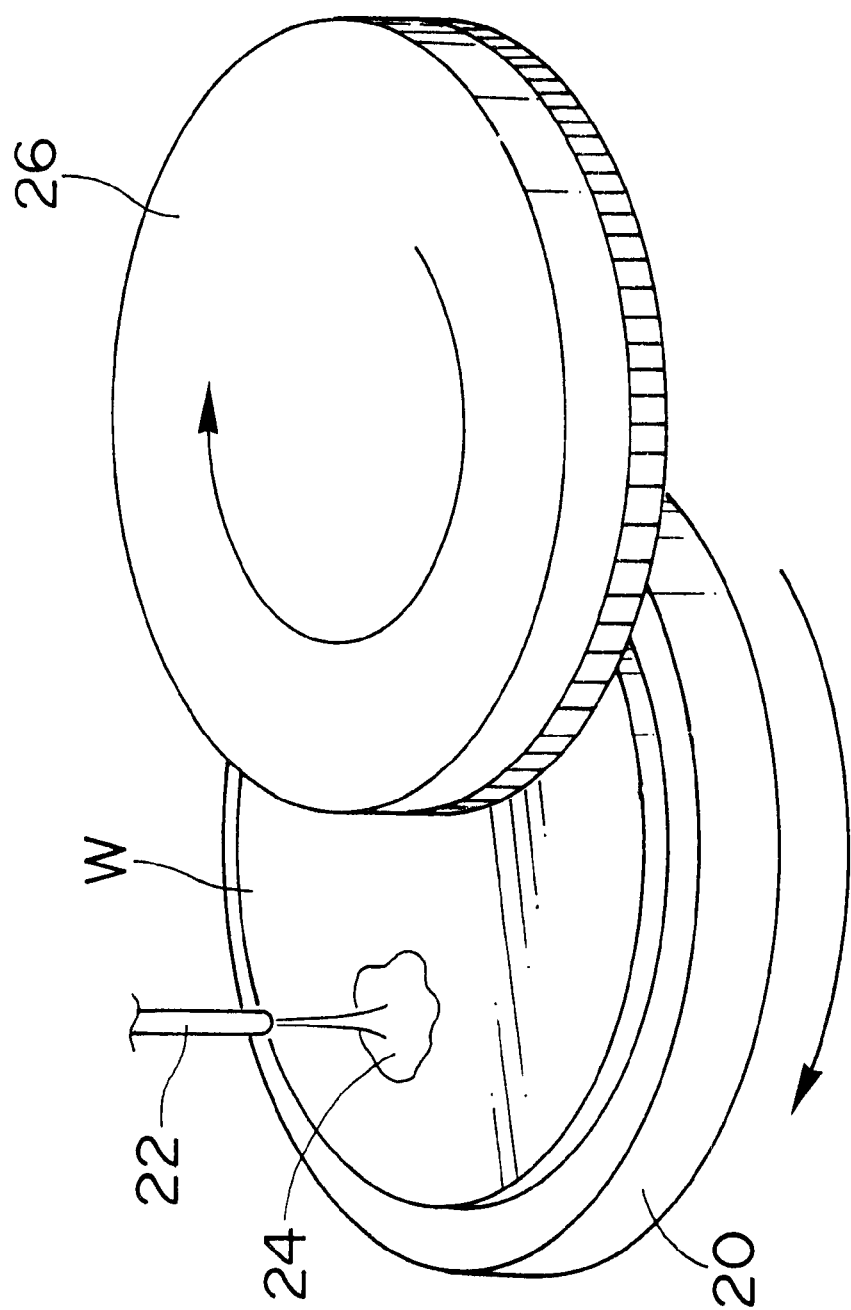
FIG. 4 is an explanatory view of a polishing process.

In the polishing process (step S2), the reverse of the wafer W is polished so that a broken layer, which is formed on the reverse of the wafer W during the back grinding, is removed. As shown in FIG. 4, in the polishing process, the wafer W is first placed on the chuck table 20 with the reverse turned up, and the bottom face (in this state the obverse, on which the chips are formed) of the wafer W is held by suction by the chuck table 20 and is rotated. Then, the top face (in this state the reverse) of the wafer W is polished by pressing a rotating polishing pad 26 against the reverse of the wafer W while supplying slurry 24 from a nozzle 22 to the reverse of the rotating wafer W.

The wafer W is processed in the polishing process in the state where the protecting sheet 14 is adhered to the obverse of the wafer W in order to protect the chips C, C, . . . on the obverse of the wafer W.

Figure 5:
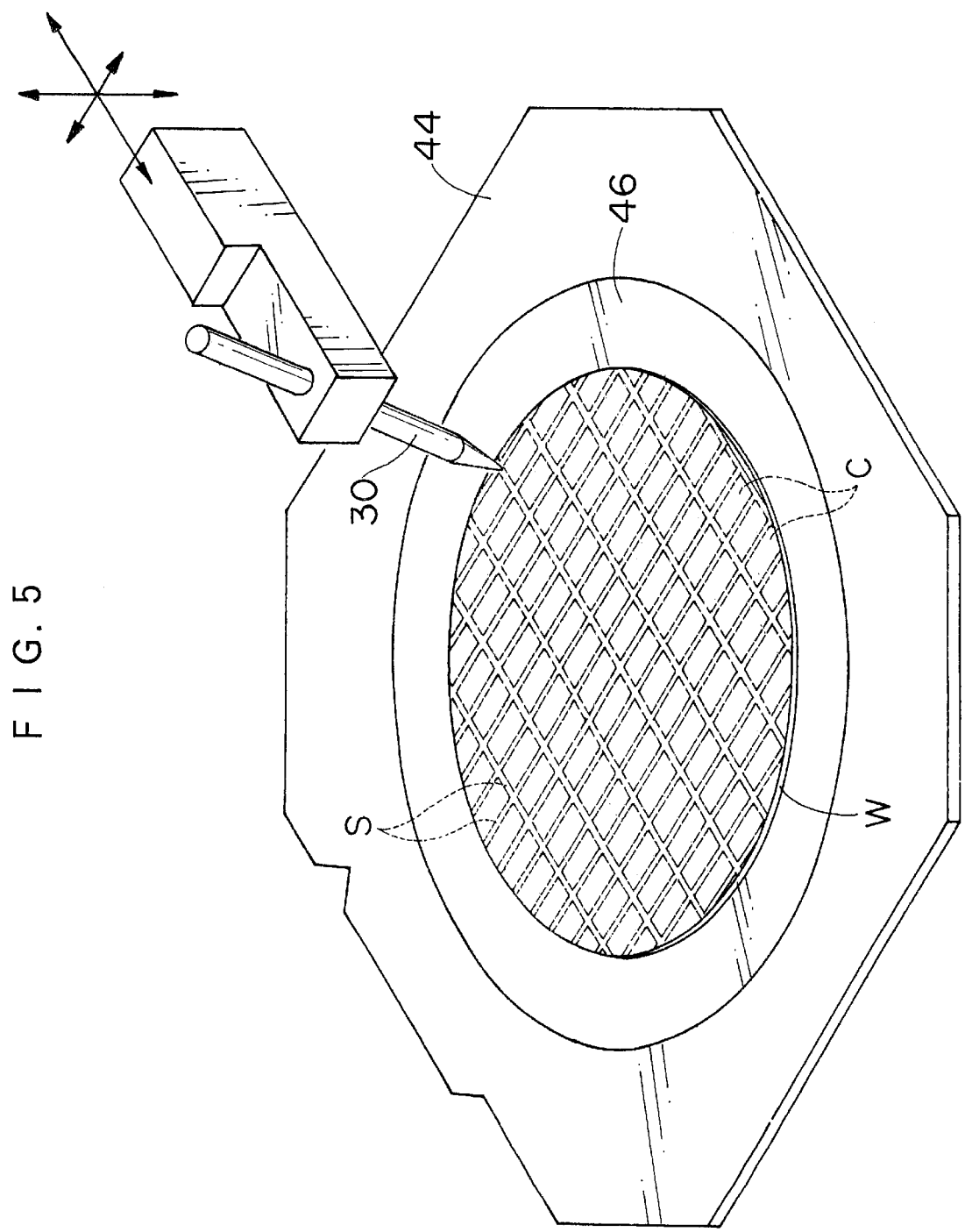
FIG. 5 is an explanatory view of a scribing process.

In the scribing process (step S3), grooves G in a predetermined depth are formed on the reverse of the wafer W along streets S, which are formed on the obverse between the chips C, C, . . . As shown in FIG. 5, in the scribing process, grooves G in the predetermined depth are formed on the reverse of the wafer W along the streets S on the obverse scratching the obverse of the wafer W along the streets S with a scribing cutter or a diamond point cutter 30, and at the same time strain is generated inside the wafer W by the concentrated stress, so that the wafer W can be easily cleft.

The grooves G formed on the reverse of the wafer W in the manner as described above are formed along the streets S, which are formed on the obverse of the wafer W; however, the streets S on the obverse of the wafer W cannot be observed by irradiating and imaging the reverse of the wafer W with normal light.

In view of the above, locations of the reverse of the wafer W corresponding with the streets S are aligned form the reverse in the manner presented below, and the grooves G are formed on the reverse of the wafer W along the streets S in accordance with the results of the alignment.

Figure 6:
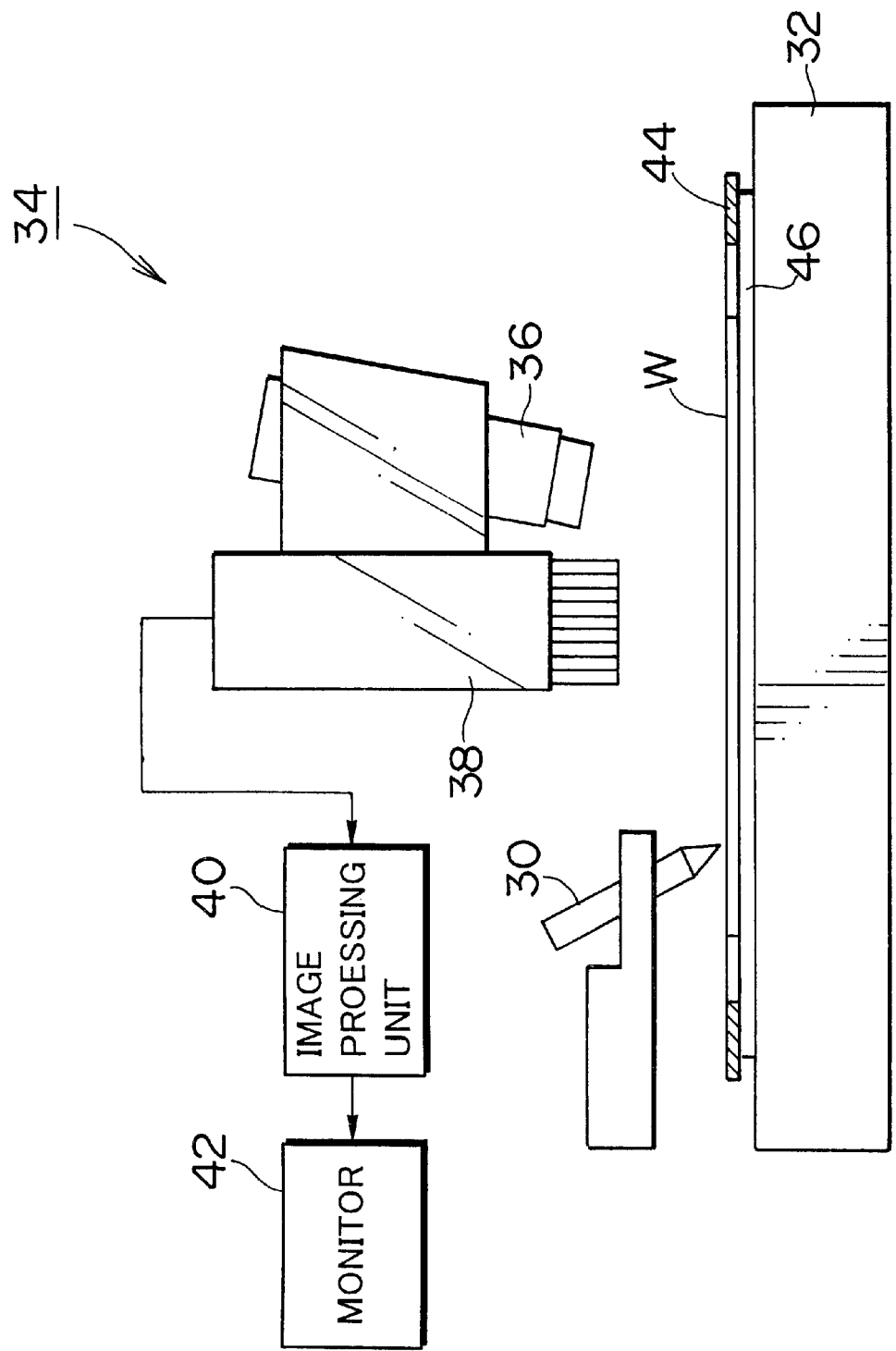
FIG. 6 is a front view showing the construction of the alignment unit.

As shown in FIG. 6, the wafer W is held to the chuck table 32 by suction in a state where its reverse is turned up. The grooving process is performed on the chuck table 32 by the diamond point cutter 30.

An alignment unit 34 for aligning the wafer W on the chuck table 32 is disposed over the chuck table 32. The alignment unit 34 comprises an infrared irradiating device 36, an infrared camera 38, an image processing unit 40, and a monitor 42.

The infrared irradiating device 36 irradiates the top face (the reverse in this case) of the wafer W, which is held at the chuck table 32, with infrared light. At this point, the infrared light from the infrared irradiating device 36 penetrates into the wafer W. The infrared camera 38 captures the infrared light that has been transmitted to the inside of the wafer W and has been reflected at the obverse face of the wafer W. Then, the image processing unit 40 processes the image data captured by the infrared camera 38 and displays the captured image on the monitor 42. Thus, the streets S on the obverse of the wafer W can be observed from the reverse of the wafer W, and the locations of the reverse of the wafer W corresponding with the streets S on the obverse of the wafer W are aligned in accordance with the displayed results of the monitor 42. Then, the diamond point cutter 30 is activated and operated on the reverse of the wafer W in accordance with the results of the alignment so as to groove the reverse of the wafer W corresponding with the streets S on the obverse.

As shown in FIG. 5, the grooves are formed on the wafer W while being mounted on the wafer frame 44. The wafer frame 44 is a substantially rectangular frame with a circular opening at the inner periphery, and a wafer sheet 46 is adhered to the opening. The wafer sheet 46 is an adhesive plastic sheet, and the wafer W is mounted on the wafer frame 44 by adhering the obverse of the wafer W to the wafer sheet 46.

The protecting sheet 14 is adhered to the obverse of the wafer W through the back grinding process (step S1) and the polishing process (step S2); hence, the wafer W is mounted on the wafer frame 44 after separating the protecting sheet 14 from the obverse of the wafer W.

Figure 7A:
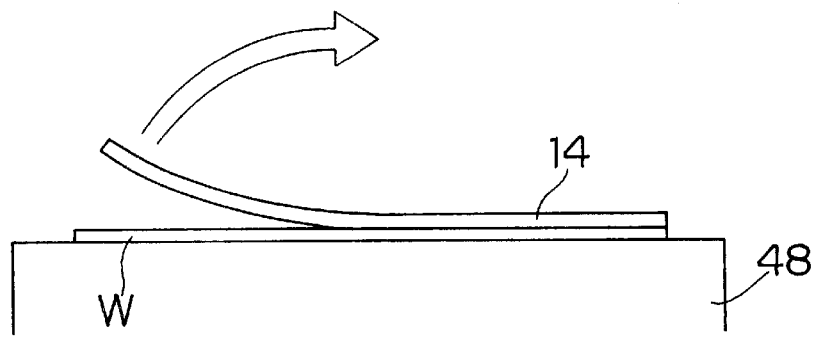
FIGS. 7(a), 7(b) and 7(c) are explanatory views of a mounting process.
Figure 7B:
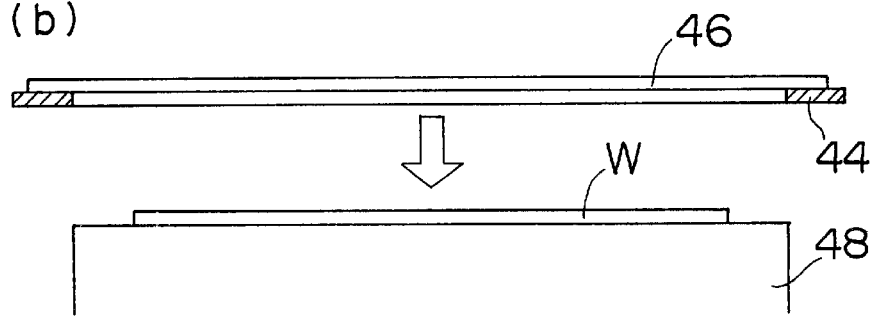
Figure 7C:
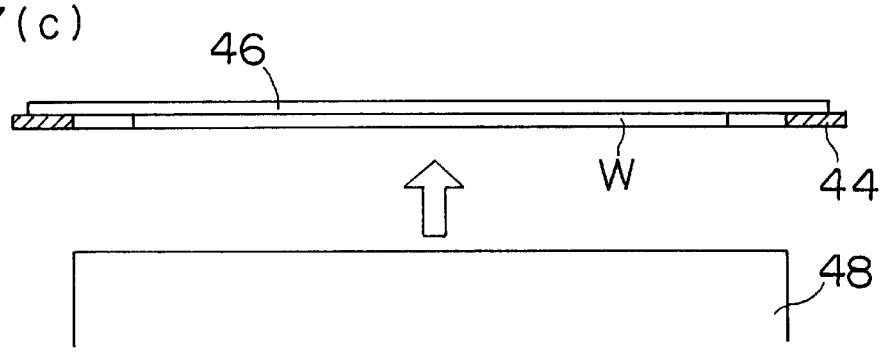

FIGS. 7(a), 7(b) and 7(c) show the mounting process of the wafer W. In FIG. 7(a), the wafer W is first held by suction by the chuck table 48 with the obverse turned up on which the protecting sheet 14 is adhered. Then, the protecting sheet 14 is separated from the obverse of the wafer W. Then, as shown in FIG. 7(b), the wafer sheet 46 that is adhered to the wafer frame 44 is adhered to the obverse of the wafer W. Thereby, the wafer W is mounted on the wafer frame 44, and the wafer W is released from the chuck table 48 and the wafer frame 44 is collected as shown in FIG. 7(c).

In the above example, the wafer W is mounted on the wafer frame 44 after separating the protecting sheet 14 from the obverse of the wafer W; however, the wafer W may be mounted while the protecting sheet 14 is being adhered. In other words, the wafer W may be mounted on the wafer frame 44 by adhering the protecting sheet 14 to the wafer sheet 46 of the wafer frame 44.

Figure 8:
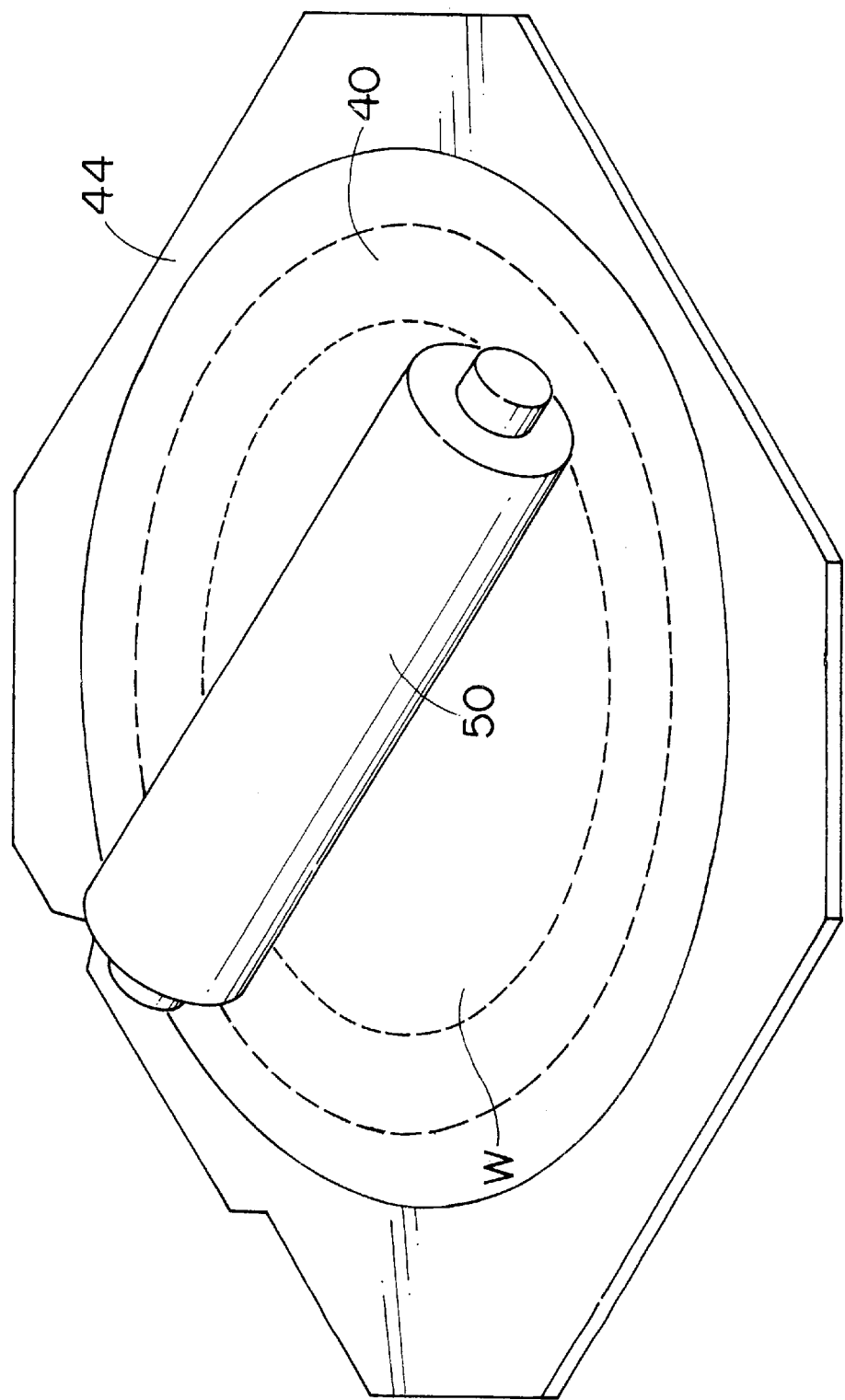
FIG. 8 is another explanatory view of a breaking process.
Figure 9:
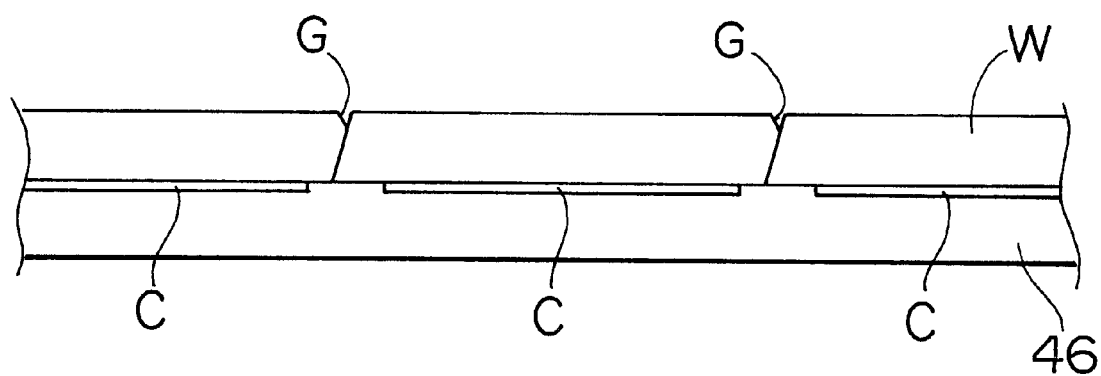
FIG. 9 is another explanatory view of the breaking process.

In the breaking process (step S4), the wafer W is cleft along the grooves G, which are formed on the reverse of the wafer W in the scribing process, so as to divide the wafer W into separate chips C, C, . . . As shown in FIG. 8, in the breaking process, a rubber roller 50 is pressed against the bottom (the obverse at the moment) face of the wafer W, which is held in the wafer frame 44, and the wafer W is divided into separate chips C by moving the rubber roller 40 over the bottom face of the wafer W. In other words, when the bottom face of the wafer W is pressed by the rubber roller 50 over the wafer sheet 46, splits develop along the grooves G, which are previously formed, as shown in FIG. 9, and the wafer W is divided into separate chips along the splits.

The wafer W is thus divided into separate chips by using cleavage. Since the cleavage develops along a cleavage plane, which is determined by a direction of the crystal axis of the wafer W, the wafer W is divided into chips with smooth surfaces and also with less chipping.

Figure 10:
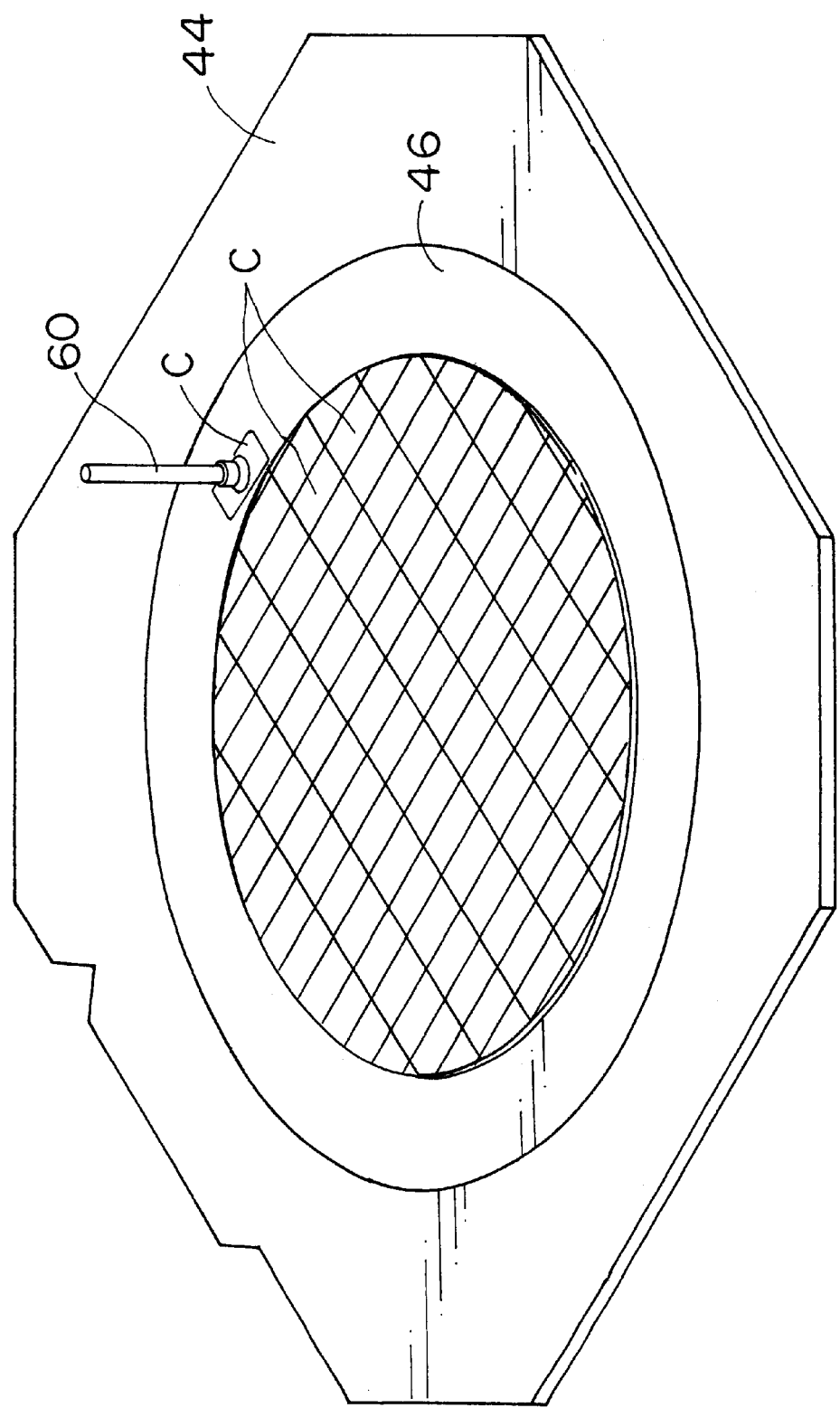
FIG. 10 is an explanatory view of a picking-up process.

In the pick-up process (step S5), the chips C, C, . . . , which are separated in the breaking process, are collected from the wafer frame 44. At the beginning of this process, the wafer sheet 46 is irradiated with ultraviolet light from the reverse of the wafer frame 44. By the irradiation, the adhesive of the wafer sheet 46, to which the chips C, C, . . . are adhered, is hardened, and the chips C can be separated from the wafer sheet 46. Then, as shown in FIG. 10, the chips C are collected one after another by a suction pad 60, and the chips C are rearranged on a tray (not shown). In this process, preferably, only the chips C with good quality can be picked up and collected while the chips C are turned the obverse up.

As described above, in the method of manufacturing the semiconductor chips of the present embodiment, the reverse of the wafer W is polished after grinding the reverse of the wafer W to make the wafer W thin, thereby the broken layer, which is formed during the back grinding, is removed, and the wafer W is divided into separate chips C, C, . . . by using the cleavage. Thus as presented, since the reverse of the wafer W, which is ground to make the wafer W thin, is polished so that the broken layer of the wafer W is removed, the strength of the chips is improved. Moreover, chipping at the reverse of the wafer W can be effectively prevented from being generated by dividing the wafer W with no broken layer into chips using the cleavage.

In particular, if the wafer W is processed as thin as 200 μm or less by the back grinding process, many cracks and chipping are generated on the chips by completely cutting (full-cut) the wafer W in the dicing process. However, by dividing the wafer W into chips using the cleavage after removing the broken layer and forming the grooves on the reverse, the cracks and chipping on the chips can be effectively prevented.

The present embodiment uses a method of polishing the reverse of the wafer W to remove the broken layer; however, the broken layer may be removed by etching. In the etching process, the obverse of the wafer W is held by suction by a chuck table and rotated in the state where the reverse is turned up, and the reverse of the wafer W is etched by supplying etching liquid from a nozzle to the reverse of the wafer W (so-called spin etching).

Figure 11:
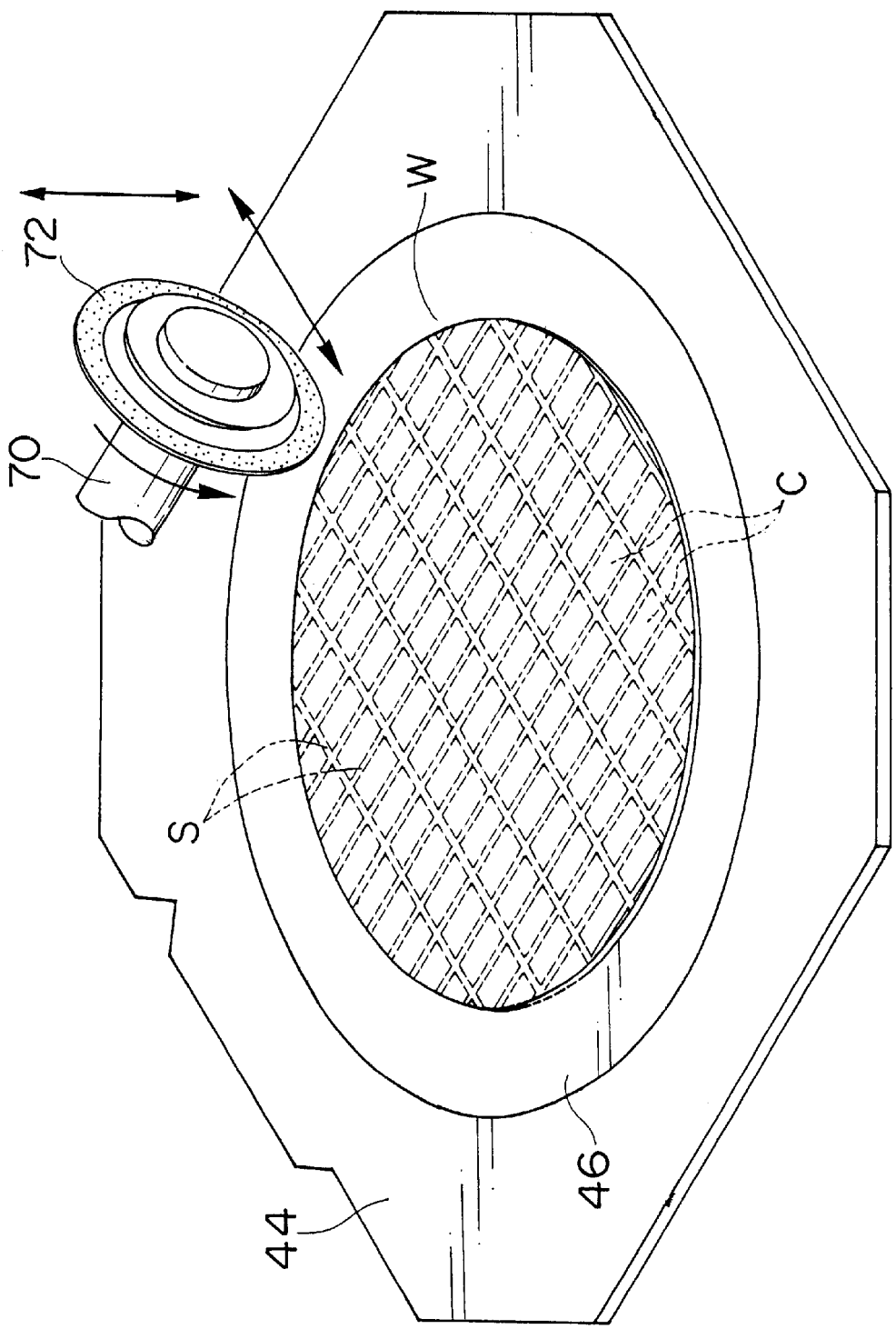
FIG. 11 is a perspective view showing the construction of a dicing device.

The present embodiment uses the scribing device or the diamond point cutter 30 to form the grooves G on the reverse of the wafer W along the streets S formed on the obverse of the wafer W; however, a dicing device may be used instead of the scribing device. As shown in FIG. 11, the dicing device forms the grooves G in the predetermined depth on the reverse of the wafer W by an extremely thin outer peripheral blade (dicing blade) 72 attached at the end of a spindle 70, which rotates at a high speed.

According to the above-described embodiment, the scribing device achieves a manufacturing process with a dry process and an inexpensive machine.

In the case that the scribing cutter cannot sufficiently generate the strain inside the wafer W, shallow grooves are formed on the reverse of the wafer W by the dicing blade of the dicing device, and the bottom of the shallow grooves are scratched with the scribing cutter of the scribing device, whereby the wafer W can be clearly cleft by the breaking process afterwards.

Moreover, to present a method of cleaving the wafer W into separate chips in the present embodiment, the rubber roller 50 is pressed against the obverse of the wafer W and is moved over the obverse of the wafer W. However, other alternative methods such as developing splits by tugging the wafer sheet 46, to which the wafer W is adhered, in side directions, or developing splits by pushing chips C one after another from the reverse of the wafer W.

In the present embodiment, cleaning of the wafer W is not mentioned; however, when transporting the wafer W between the processes, it is preferable to transport the wafer W after being cleaned and dried.

In the present embodiment, the wafer W is processed through the scribing process (step S3), the breaking process (step S4), and the picking-up process (step S5) while being mounted on the wafer frame 44. However, the wafer W may be processed without mounting the wafer W on the wafer frame 44. In other words, the wafer W may be processed through the scribing process, breaking process, and the picking-up process in the state where the protecting sheet 14 is adhered to the obverse of the wafer W. Like the present embodiment, the wafer W can be easily handled by processing the wafer W while mounting the wafer W on the wafer frame 44.

As described hereinabove, in the method of manufacturing the semiconductor chips of the present invention, the reverse of the wafer is ground first and is polished or etched whereby the broken layer, which is formed during the back grinding, is removed. Thus, the strength of the chips is improved. Furthermore, by dividing the wafer W with no broken layer into separate chips using the cleavage, cracks and chips can be effectively reduced.

It should be understood, however, that there is no intention to limit the invention to the specific forms disclosed, but on the contrary, the invention is to cover all modifications, alternate constructions and equivalents falling within the spirit and scope of the invention as expressed in the appended claims.

What is claimed is:

1. A method for manufacturing semiconductor chips, comprising the steps of:

grinding a reverse of a wafer so as to shape the wafer in a predetermined thickness, the chips being formed on an obverse of the wafer;

removing, by at least one of polishing and etching, a broken layer formed on the reverse of the wafer in the reverse grinding step;

forming grooves on the reverse of the wafer in a predetermined depth along streets formed between the chips; and cleaving the wafer along the grooves so as to separate the chips, wherein no grooves are formed on the obverse of the wafer so that the cleaving step only occurs on the reverse of the wafer.

2. The method as defined in claim 1, wherein the groove forming step comprises the step of scratching the reverse of the wafer along the streets with a scribing cutter to form the grooves.

3. The method as defined in claim 1, wherein the groove forming step comprises the step of grooving the reverse of the wafer in the predetermined depth along the streets with a dicing blade to form the grooves.

4. The method as defined in claim 1, wherein the groove forming step comprises the steps of:

aligning locations of the reverse of the wafer to correspond with the streets on the obverse of the wafer by irradiating the reverse of the wafer with light penetrating into the wafer; and forming the grooves in accordance with a result of the aligning step.

5. The method as defined in claim 4, wherein the groove forming step further comprises the step of scratching the reverse of the wafer along the streets with a scribing cutter to form the grooves.

6. The method as defined in claim 4, wherein the groove forming step further comprises the step of grooving the reverse of the wafer in the predetermined depth along the streets with a dicing blade to form the grooves.

7. A method for manufacturing semiconductor chips, comprising the steps of:

grinding a reverse of a wafer so as to shape the wafer in a predetermined thickness, the chips being formed on an obverse of the wafer;

removing, by at least one of polishing and etching, a broken layer formed on the reverse of the wafer in the reverse grinding step;

forming grooves on the reverse of the wafer in a predetermined depth along streets formed between the chips; and cleaving the wafer along the grooves so as to separate the chips, wherein the groove forming step comprises the steps of:

grooving the reverse of the wafer in the predetermined depth along the streets with a dicing blade to form the grooves; and then scratching bottoms of the grooves with a scribing cutter.

8. A method for manufacturing semiconductor chips, comprising the steps of:

grinding a reverse of a wafer so as to shape the wafer in a predetermined thickness, the chips being formed on an obverse of the wafer;

removing, by at least one of polishing and etching, a broken layer formed on the reverse of the wafer in the reverse grinding step;

forming grooves on the reverse of the wafer in a predetermined depth along streets formed between the chips; and cleaving the wafer along the grooves so as to separate the chips, wherein the groove forming step comprises the steps of:

aligning locations of the reverse of the wafer to correspond with the streets on the obverse of the wafer by irradiating the reverse of the wafer with light penetrating into the wafer;

forming the grooves in accordance with a result of the aligning step;

grooving the reverse of the wafer in the predetermined depth along the streets with a dicing blade to form the grooves; and then scratching bottoms of the grooves with a scribing cutter.

* * * * *